US 6,693,298 B2

(12) United States Patent
Eisenbeiser et al.

(10) Patent No.: US 6,693,298 B2
(45) Date of Patent: Feb. 17, 2004

(54) STRUCTURE AND METHOD FOR FABRICATING EPITAXIAL SEMICONDUCTOR ON INSULATOR (SOI) STRUCTURES AND DEVICES UTILIZING THE FORMATION OF A COMPLIANT SUBSTRATE FOR MATERIALS USED TO FORM SAME

(75) Inventors: Kurt W. Eisenbeiser, Tempe, AZ (US); Zhiyi Yu, Gilbert, AZ (US); Ravindranath Droopad, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/908,707

(22) Filed: Jul. 20, 2001

(65) Prior Publication Data

US 2003/0015702 A1 Jan. 23, 2003

(51) Int. Cl.[7] .................. H01L 29/04; H01L 31/036; H01L 31/0336; H01L 31/109
(52) U.S. Cl. .................. 257/63; 257/189; 257/190
(58) Field of Search .................. 257/63, 189, 190, 257/200, 201, 295, 305

(56) References Cited

U.S. PATENT DOCUMENTS

| 3,617,951 | A | 11/1971 | Anderson |
| 3,670,213 | A | 6/1972 | Nakawaga et al. |
| 3,766,370 | A | 10/1973 | Walther |
| 3,802,967 | A | 4/1974 | Ladany et al. |
| 3,914,137 | A | 10/1975 | Huffman et al. |
| 3,935,031 | A | 1/1976 | Adler |
| 4,006,989 | A | 2/1977 | Andringa |

(List continued on next page.)

FOREIGN PATENT DOCUMENTS

| DE | 196 07 107 | 8/1997 |
| DE | 197 12 496 | 10/1997 |
| DE | 100 17 137 | 10/2000 |
| EP | 0 250 171 | 12/1987 |
| EP | 0 300 499 | 1/1989 |

(List continued on next page.)

OTHER PUBLICATIONS

Kaushik et al., Device Characteristics of Cyrstalline Epitaxial Oxides on Silicon Jun. 19, 2000 58th Annual Device Research Conference, pp. 17–20.*

Charles Kittel; "Introduction to Solid State Physics"; John Wiley & Sons, Inc. Fifth Edition; p. 415.

(List continued on next page.)

*Primary Examiner*—John F. Niebling
*Assistant Examiner*—Walter L. Lindsay, Jr.
(74) *Attorney, Agent, or Firm*—Oblon, Spivak, McClelland, Maier & Neustadt, P.C.

(57) ABSTRACT

High quality epitaxial layers of monocrystalline materials can be grown overlying monocrystalline substrates such as large silicon wafers by forming a compliant substrate for growing the monocrystalline layers. An accommodating buffer layer comprises a layer of monocrystalline oxide spaced apart from the silicon wafer by an amorphous interface layer of silicon oxide. The amorphous interface layer dissipates strain and permits the growth of a high quality monocrystalline oxide accommodating buffer layer. The accommodating buffer layer is lattice matched to both the underlying silicon wafer and the overlying monocrystalline material layer. A monocrystalline layer is then formed over the accommodating buffer layer, such that a lattice constant of the monocrystalline layer substantially matches the lattice constant of a subsequently grown monocrystalline film.

22 Claims, 3 Drawing Sheets

U.S. PATENT DOCUMENTS

| | | |
|---|---|---|
| 4,084,130 A | 4/1978 | Holton |
| 4,120,588 A | 10/1978 | Chaum |
| 4,146,297 A | 3/1979 | Alferness et al. |
| 4,174,422 A | 11/1979 | Matthews et al. |
| 4,177,094 A | 12/1979 | Kroon |
| 4,242,595 A | 12/1980 | Lehovec |
| 4,284,329 A | 8/1981 | Smith et al. |
| 4,289,920 A | 9/1981 | Hovel |
| 4,297,656 A | 10/1981 | Pan |
| 4,392,297 A | 7/1983 | Little |
| 4,398,342 A | 8/1983 | Pitt et al. |
| 4,404,265 A | 9/1983 | Manasevit |
| 4,424,589 A | 1/1984 | Thomas et al. |
| 4,439,014 A | 3/1984 | Stacy et al. |
| 4,442,590 A | 4/1984 | Stockton et al. |
| 4,452,720 A | 6/1984 | Harada et al. |
| 4,459,325 A | 7/1984 | Nozawa et al. |
| 4,482,422 A | 11/1984 | McGinn et al. |
| 4,482,906 A | 11/1984 | Hovel et al. |
| 4,484,332 A | 11/1984 | Hawrylo |
| 4,503,540 A | 3/1985 | Nakashima et al. |
| 4,523,211 A | 6/1985 | Morimoto et al. |
| 4,594,000 A | 6/1986 | Falk et al. |
| 4,629,821 A | 12/1986 | Bronstein-Bonte et al. |
| 4,661,176 A | 4/1987 | Manasevit |
| 4,667,088 A | 5/1987 | Kramer et al. |
| 4,667,212 A | 5/1987 | Nakamura |
| 4,681,982 A | 7/1987 | Yoshida |
| 4,695,120 A | 9/1987 | Holder |
| 4,748,485 A | 5/1988 | Vasudev |
| 4,756,007 A | 7/1988 | Qureshi et al. |
| 4,772,929 A | 9/1988 | Manchester et al. |
| 4,773,063 A | 9/1988 | Hunsperger et al. |
| 4,774,205 A | 9/1988 | Choi et al. |
| 4,777,613 A | 10/1988 | Shahan et al. |
| 4,793,872 A | 12/1988 | Meunier et al. |
| 4,801,184 A | 1/1989 | Revelli |
| 4,802,182 A | 1/1989 | Thornton et al. |
| 4,804,866 A | 2/1989 | Akiyama |
| 4,815,084 A | 3/1989 | Scifres et al. |
| 4,841,775 A | 6/1989 | Ikeda et al. |
| 4,845,044 A | 7/1989 | Ariyoshi et al. |
| 4,846,926 A | 7/1989 | Kay et al. |
| 4,855,249 A | 8/1989 | Akasaki et al. |
| 4,866,489 A | 9/1989 | Yokogawa et al. |
| 4,868,376 A | 9/1989 | Lessin et al. |
| 4,872,046 A | 10/1989 | Morkoc et al. |
| 4,876,208 A | 10/1989 | Gustafson et al. |
| 4,876,219 A | 10/1989 | Eshita et al. |
| 4,882,300 A | 11/1989 | Inoue et al. |
| 4,885,376 A | 12/1989 | Verkade |
| 4,888,202 A | 12/1989 | Murakami et al. |
| 4,889,402 A | 12/1989 | Reinhart |
| 4,891,091 A | 1/1990 | Shastry |
| 4,896,194 A | 1/1990 | Suzuki |
| 4,901,133 A | 2/1990 | Curran et al. |
| 4,910,164 A | 3/1990 | Shichijo |
| 4,912,087 A | 3/1990 | Aslam et al. |
| 4,928,154 A | 5/1990 | Umeno et al. |
| 4,934,777 A | 6/1990 | Jou et al. |
| 4,952,420 A | 8/1990 | Walters |
| 4,959,702 A | 9/1990 | Moyer et al. |
| 4,963,508 A | 10/1990 | Umeno et al. |
| 4,963,949 A | 10/1990 | Wanlass et al. |
| 4,965,649 A | 10/1990 | Zanio et al. |
| 4,981,714 A | 1/1991 | Ohno et al. |
| 4,984,043 A | 1/1991 | Vinal |
| 4,999,842 A | 3/1991 | Huang et al. |
| 5,018,816 A | 5/1991 | Murray et al. |
| 5,028,563 A | 7/1991 | Feit et al. |
| 5,028,976 A | 7/1991 | Ozaki et al. |
| 5,051,790 A | 9/1991 | Hammer |
| 5,053,835 A | 10/1991 | Horikawa et al. |
| 5,055,445 A | 10/1991 | Belt et al. |
| 5,055,835 A | 10/1991 | Sutton |
| 5,057,694 A | 10/1991 | Idaka et al. |
| 5,060,031 A | 10/1991 | Abrokwah et al. |
| 5,063,081 A | 11/1991 | Cozzette et al. |
| 5,063,166 A | 11/1991 | Mooney et al. |
| 5,067,809 A | 11/1991 | Tsubota |
| 5,073,981 A | 12/1991 | Giles et al. |
| 5,075,743 A | 12/1991 | Behfar-Rad |
| 5,081,062 A | 1/1992 | Vasudev et al. |
| 5,081,519 A | 1/1992 | Nishimura |
| 5,087,829 A | 2/1992 | Ishibashi et al. |
| 5,103,494 A | 4/1992 | Mozer |
| 5,116,461 A | 5/1992 | Lebby et al. |
| 5,119,448 A | 6/1992 | Schaefer et al. |
| 5,122,852 A | 6/1992 | Chan et al. |
| 5,127,067 A | 6/1992 | Delcoco et al. |
| 5,130,762 A | 7/1992 | Kulick |
| 5,132,648 A | 7/1992 | Trinh et al. |
| 5,140,387 A | 8/1992 | Okazaki et al. |
| 5,140,651 A | 8/1992 | Soref et al. |
| 5,141,894 A | 8/1992 | Bisaro et al. |
| 5,143,854 A | 9/1992 | Pirrung et al. |
| 5,144,409 A | 9/1992 | Ma |
| 5,148,504 A | 9/1992 | Levi et al. |
| 5,155,658 A | 10/1992 | Inam et al. |
| 5,159,413 A | 10/1992 | Calviello et al. |
| 5,163,118 A | 11/1992 | Lorenzo et al. |
| 5,173,474 A | 12/1992 | Connell et al. |
| 5,173,835 A | 12/1992 | Cornett et al. |
| 5,181,085 A | 1/1993 | Moon et al. |
| 5,185,589 A | 2/1993 | Krishnaswamy et al. |
| 5,191,625 A | 3/1993 | Gustavsson |
| 5,194,397 A | 3/1993 | Cook et al. |
| 5,194,917 A | 3/1993 | Regener |
| 5,198,269 A | 3/1993 | Swartz et al. |
| 5,208,182 A | 5/1993 | Narayan et al. |
| 5,210,763 A | 5/1993 | Lewis et al. |
| 5,216,359 A | 6/1993 | Makki et al. |
| 5,216,729 A | 6/1993 | Berger et al. |
| 5,221,367 A | 6/1993 | Chisholm et al. |
| 5,225,031 A | 7/1993 | McKee et al. |
| 5,227,196 A | 7/1993 | Itoh |
| 5,244,818 A | 9/1993 | Jokers et al. |
| 5,248,564 A | 9/1993 | Ramesh |
| 5,260,394 A | 11/1993 | Tazaki et al. |
| 5,262,659 A | 11/1993 | Grudkowski et al. |
| 5,266,355 A | 11/1993 | Wernberg et al. |
| 5,268,327 A | 12/1993 | Vernon |
| 5,270,298 A | 12/1993 | Ramesh |
| 5,280,013 A | 1/1994 | Newman et al. |
| 5,281,834 A | 1/1994 | Cambou et al. |
| 5,283,462 A | 2/1994 | Stengel |
| 5,286,985 A | 2/1994 | Taddiken |
| 5,293,050 A | 3/1994 | Chapple-Sokol et al. |
| 5,306,649 A | 4/1994 | Hebert |
| 5,310,707 A | 5/1994 | Oishi et al. |
| 5,312,765 A | 5/1994 | Kanber |
| 5,314,547 A | 5/1994 | Heremans et al. |
| 5,323,023 A | 6/1994 | Fork |
| 5,326,721 A | 7/1994 | Summerfelt |
| 5,334,556 A | 8/1994 | Guldi |
| 5,352,926 A | 10/1994 | Andrews |
| 5,356,509 A | 10/1994 | Terranova et al. |
| 5,356,831 A | 10/1994 | Calviello et al. |
| 5,357,122 A | 10/1994 | Okubora et al. |
| 5,358,925 A | 10/1994 | Neville Connell et al. |
| 5,362,972 A | 11/1994 | Yazawa et al. |

| | | | | | | |
|---|---|---|---|---|---|---|
| 5,371,621 A | 12/1994 | Stevens | | 5,572,052 A | 11/1996 | Kashihara et al. |
| 5,371,734 A | 12/1994 | Fischer | | 5,574,296 A | 11/1996 | Park et al. |
| 5,372,992 A | 12/1994 | Itozaki et al. | | 5,574,589 A | 11/1996 | Feuer et al. |
| 5,373,166 A | 12/1994 | Buchan et al. | | 5,576,879 A | 11/1996 | Nashimoto |
| 5,391,515 A | 2/1995 | Kao et al. | | 5,578,162 A | 11/1996 | D'Asaro et al. |
| 5,393,352 A | 2/1995 | Summerfelt | | 5,585,167 A | 12/1996 | Satoh et al. |
| 5,394,489 A | 2/1995 | Koch | | 5,585,288 A | 12/1996 | Davis et al. |
| 5,395,663 A | 3/1995 | Tabata et al. | | 5,588,995 A | 12/1996 | Sheldon |
| 5,397,428 A | 3/1995 | Stoner et al. | | 5,589,284 A | 12/1996 | Summerfelt et al. |
| 5,399,898 A | 3/1995 | Rostoker | | 5,596,205 A | 1/1997 | Reedy et al. |
| 5,404,581 A | 4/1995 | Honjo | | 5,596,214 A | 1/1997 | Endo |
| 5,405,802 A | 4/1995 | Yamagata et al. | | 5,602,418 A | 2/1997 | Imai et al. |
| 5,406,202 A | 4/1995 | Mehrgardt et al. | | 5,603,764 A | 2/1997 | Matsuda et al. |
| 5,410,622 A | 4/1995 | Okada et al. | | 5,606,184 A | 2/1997 | Abrokwah et al. |
| 5,418,216 A | 5/1995 | Fork | | 5,608,046 A | 3/1997 | Cook et al. |
| 5,418,389 A | 5/1995 | Watanabe | | 5,610,744 A | 3/1997 | Ho et al. |
| 5,420,102 A | 5/1995 | Harshavardhan et al. | | 5,614,739 A | 3/1997 | Abrokwah et al. |
| 5,427,988 A | 6/1995 | Sengupta et al. | | 5,619,051 A | 4/1997 | Endo |
| 5,436,759 A | 7/1995 | Dijaii et al. | | 5,621,227 A | 4/1997 | Joshi |
| 5,438,584 A | 8/1995 | Paoli et al. | | 5,623,439 A | 4/1997 | Gotoh et al. |
| 5,441,577 A | 8/1995 | Sasaki et al. | | 5,623,552 A | 4/1997 | Lane |
| 5,442,191 A | 8/1995 | Ma | | 5,629,534 A | 5/1997 | Inuzuka et al. |
| 5,442,561 A | 8/1995 | Yoshizawa et al. | | 5,633,724 A | 5/1997 | King et al. |
| 5,444,016 A | 8/1995 | Abrokwah et al. | | 5,635,433 A | 6/1997 | Sengupta |
| 5,446,719 A | 8/1995 | Yoshida et al. | | 5,635,453 A | 6/1997 | Pique et al. |
| 5,450,812 A | 9/1995 | McKee et al. | | 5,640,267 A | 6/1997 | May et al. |
| 5,452,118 A | 9/1995 | Maruska | | 5,650,646 A | 7/1997 | Summerfelt |
| 5,453,727 A | 9/1995 | Shibasaki et al. | | 5,656,382 A | 8/1997 | Nashimoto |
| 5,466,631 A | 11/1995 | Ichikawa et al. | | 5,659,180 A | 8/1997 | Shen et al. |
| 5,473,047 A | 12/1995 | Shi | | 5,661,112 A | 8/1997 | Hatta et al. |
| 5,473,171 A | 12/1995 | Summerfelt | | 5,666,376 A | 9/1997 | Cheng |
| 5,477,363 A | 12/1995 | Matsuda | | 5,668,048 A | 9/1997 | Kondo et al. |
| 5,478,653 A * | 12/1995 | Guenzer .................... 428/446 | | 5,670,798 A | 9/1997 | Schetzina |
| 5,479,033 A | 12/1995 | Baca et al. | | 5,670,800 A | 9/1997 | Nakao et al. |
| 5,479,317 A | 12/1995 | Ramesh | | 5,674,366 A | 10/1997 | Hayashi et al. |
| 5,480,829 A | 1/1996 | Abrokwah et al. | | 5,674,813 A | 10/1997 | Nakamura et al. |
| 5,481,102 A | 1/1996 | Hazelrigg, Jr. | | 5,679,947 A | 10/1997 | Doi et al. |
| 5,482,003 A | 1/1996 | McKee et al. | | 5,679,965 A | 10/1997 | Schetzina |
| 5,484,664 A | 1/1996 | Kitahara et al. | | 5,682,046 A | 10/1997 | Takahashi et al. |
| 5,486,406 A | 1/1996 | Shi | | 5,684,302 A | 11/1997 | Wersing et al. |
| 5,491,461 A | 2/1996 | Partin et al. | | 5,686,741 A | 11/1997 | Ohori et al. |
| 5,492,859 A | 2/1996 | Sakaguchi et al. | | 5,689,123 A | 11/1997 | Major et al. |
| 5,494,711 A | 2/1996 | Takeda et al. | | 5,693,140 A | 12/1997 | McKee et al. |
| 5,504,035 A | 4/1996 | Rostoker et al. | | 5,719,417 A | 2/1998 | Roeder et al. |
| 5,504,183 A | 4/1996 | Shi | | 5,725,641 A | 3/1998 | MacLeod |
| 5,508,554 A | 4/1996 | Takatani et al. | | 5,729,394 A | 3/1998 | Sevier et al. |
| 5,510,665 A | 4/1996 | Conley | | 5,729,641 A | 3/1998 | Chandonnet et al. |
| 5,511,238 A | 4/1996 | Bayraktaroglu | | 5,731,220 A | 3/1998 | Tsu et al. |
| 5,512,773 A | 4/1996 | Wolf et al. | | 5,733,641 A | 3/1998 | Fork et al. |
| 5,514,484 A | 5/1996 | Nashimoto | | 5,734,672 A | 3/1998 | McMinn et al. |
| 5,514,904 A | 5/1996 | Onga et al. | | 5,735,949 A | 4/1998 | Mantl et al. |
| 5,515,047 A | 5/1996 | Yamakido et al. | | 5,741,724 A | 4/1998 | Ramdani et al. |
| 5,515,810 A | 5/1996 | Yamashita et al. | | 5,745,631 A | 4/1998 | Reinker |
| 5,516,725 A | 5/1996 | Chang et al. | | 5,753,300 A | 5/1998 | Wessels et al. |
| 5,519,235 A | 5/1996 | Ramesh | | 5,753,928 A | 5/1998 | Krause |
| 5,528,057 A | 6/1996 | Yanagase et al. | | 5,754,319 A | 5/1998 | Van De Voorde et al. |
| 5,528,067 A | 6/1996 | Farb et al. | | 5,760,426 A | 6/1998 | Marx et al. |
| 5,528,209 A | 6/1996 | Macdonald et al. | | 5,760,427 A | 6/1998 | Onda |
| 5,528,414 A | 6/1996 | Oakley | | 5,764,676 A | 6/1998 | Paoli et al. |
| 5,530,235 A | 6/1996 | Stefik et al. | | 5,767,543 A | 6/1998 | Ooms et al. |
| 5,538,941 A | 7/1996 | Findikoglu et al. | | 5,770,887 A | 6/1998 | Tadatomo et al. |
| 5,541,422 A | 7/1996 | Wolf et al. | | 5,772,758 A | 6/1998 | Collins et al. |
| 5,549,977 A | 8/1996 | Jin et al. | | 5,776,359 A | 7/1998 | Schultz et al. |
| 5,551,238 A | 9/1996 | Prueitt | | 5,776,621 A | 7/1998 | Nashimoto |
| 5,552,547 A | 9/1996 | Shi | | 5,777,350 A | 7/1998 | Nakamura et al. |
| 5,553,089 A | 9/1996 | Seki et al. | | 5,777,762 A | 7/1998 | Yamamoto |
| 5,556,463 A | 9/1996 | Guenzer | | 5,778,018 A | 7/1998 | Yoshikawa et al. |
| 5,559,368 A | 9/1996 | Hu et al. | | 5,778,116 A | 7/1998 | Tomich |
| 5,561,305 A | 10/1996 | Smith | | 5,780,311 A | 7/1998 | Beasom et al. |
| 5,569,953 A | 10/1996 | Kikkawa et al. | | 5,789,733 A | 8/1998 | Jachimowicz et al. |
| 5,570,226 A | 10/1996 | Ota | | 5,789,845 A | 8/1998 | Wadaka et al. |

| Patent Number | Date | Inventor(s) | Patent Number | Date | Inventor(s) |
|---|---|---|---|---|---|
| 5,790,583 A | 8/1998 | Ho | 6,002,375 A | 12/1999 | Corman et al. |
| 5,792,569 A | 8/1998 | Sun et al. | 6,008,762 A | 12/1999 | Nghiem |
| 5,792,679 A | 8/1998 | Nakato | 6,011,641 A | 1/2000 | Shin et al. |
| 5,796,648 A | 8/1998 | Kawakubo et al. | 6,011,646 A | 1/2000 | Mirkarimi et al. |
| 5,801,072 A | 9/1998 | Barber | 6,013,553 A | 1/2000 | Wallace et al. |
| 5,801,105 A | 9/1998 | Yano et al. | 6,020,222 A | 2/2000 | Wollesen |
| 5,807,440 A | 9/1998 | Kubota et al. | 6,022,140 A | 2/2000 | Fraden et al. |
| 5,810,923 A | 9/1998 | Yano et al. | 6,022,410 A | 2/2000 | Yu et al. |
| 5,812,272 A | 9/1998 | King et al. | 6,022,963 A | 2/2000 | McGall et al. |
| 5,814,583 A | 9/1998 | Itozaki et al. | 6,023,082 A | 2/2000 | McKee et al. |
| 5,825,055 A | 10/1998 | Summerfelt | 6,028,853 A | 2/2000 | Haartsen |
| 5,825,799 A | 10/1998 | Ho et al. | 6,039,803 A | 3/2000 | Fitzgerald et al. |
| 5,827,755 A | 10/1998 | Yonhara et al. | 6,045,626 A | 4/2000 | Yano et al. |
| 5,828,080 A | 10/1998 | Yano et al. | 6,046,464 A | 4/2000 | Schetzina |
| 5,830,270 A | 11/1998 | McKee et al. | 6,048,751 A | 4/2000 | D'Asaro et al. |
| 5,831,960 A | 11/1998 | Jiang et al. | 6,049,110 A | 4/2000 | Koh |
| 5,833,603 A | 11/1998 | Kovacs et al. | 6,049,702 A | 4/2000 | Tham et al. |
| 5,834,362 A | 11/1998 | Miyagaki et al. | 6,051,858 A | 4/2000 | Uchida et al. |
| 5,838,035 A | 11/1998 | Ramesh | 6,055,179 A | 4/2000 | Koganei et al. |
| 5,838,053 A | 11/1998 | Bevan et al. | 6,058,131 A | 5/2000 | Pan |
| 5,844,260 A | 12/1998 | Ohori | 6,064,078 A | 5/2000 | Northrup et al. |
| 5,846,846 A | 12/1998 | Suh et al. | 6,064,092 A | 5/2000 | Park |
| 5,852,687 A | 12/1998 | Wickham | 6,064,783 A | 5/2000 | Congdon et al. |
| 5,857,049 A | 1/1999 | Beranek et al. | 6,078,717 A | 6/2000 | Nashimoto et al. |
| 5,858,814 A | 1/1999 | Goossen et al. | 6,080,378 A | 6/2000 | Yokota et al. |
| 5,861,966 A | 1/1999 | Ortel | 6,083,697 A | 7/2000 | Beecher et al. |
| 5,863,326 A | 1/1999 | Nause et al. | 6,087,681 A | 7/2000 | Shakuda |
| 5,864,171 A | 1/1999 | Yamamoto et al. | 6,088,216 A | 7/2000 | Laibowitz et al. |
| 5,869,845 A | 2/1999 | Vander Wagt et al. | 6,090,659 A | 7/2000 | Laibowitz et al. |
| 5,872,493 A | 2/1999 | Ella | 6,093,302 A | 7/2000 | Montgomery |
| 5,873,977 A | 2/1999 | Desu et al. | 6,096,584 A | 8/2000 | Ellis-Monaghan et al. |
| 5,874,860 A | 2/1999 | Brunel et al. | 6,100,578 A | 8/2000 | Suzuki |
| 5,878,175 A | 3/1999 | Sonoda et al. | 6,103,008 A | 8/2000 | McKee et al. |
| 5,879,956 A | 3/1999 | Seon et al. | 6,103,403 A | 8/2000 | Grigorian et al. |
| 5,880,452 A | 3/1999 | Plesko | 6,107,653 A | 8/2000 | Fitzgerald |
| 5,882,948 A | 3/1999 | Jewell | 6,107,721 A | 8/2000 | Lakin |
| 5,883,564 A | 3/1999 | Partin | 6,108,125 A | 8/2000 | Yano |
| 5,883,996 A | 3/1999 | Knapp et al. | 6,110,813 A | 8/2000 | Ota et al. |
| 5,886,867 A | 3/1999 | Chivukula et al. | 6,113,225 A | 9/2000 | Miyata et al. |
| 5,888,296 A | 3/1999 | Ooms et al. | 6,113,690 A | 9/2000 | Yu et al. |
| 5,889,296 A | 3/1999 | Imamura et al. | 6,114,996 A | 9/2000 | Nghiem |
| 5,896,476 A | 4/1999 | Wisseman et al. | 6,121,642 A | 9/2000 | Newns |
| 5,905,571 A | 5/1999 | Butler et al. | 6,121,647 A | 9/2000 | Yano et al. |
| 5,907,792 A | 5/1999 | Droopad et al. | 6,128,178 A | 10/2000 | Newns |
| 5,912,068 A | 6/1999 | Jia | 6,134,114 A | 10/2000 | Ungermann et al. |
| 5,926,493 A | 7/1999 | O'Brien et al. | 6,136,666 A | 10/2000 | So |
| 5,926,496 A | 7/1999 | Ho et al. | 6,137,603 A | 10/2000 | Henmi |
| 5,937,115 A | 8/1999 | Domash | 6,139,483 A | 10/2000 | Seabaugh et al. |
| 5,937,274 A | 8/1999 | Kondow et al. | 6,143,072 A | 11/2000 | McKee et al. |
| 5,937,285 A | 8/1999 | Abrokwah et al. | 6,143,366 A | 11/2000 | Lu |
| 5,948,161 A | 9/1999 | Kizuki | 6,146,906 A | 11/2000 | Inoue et al. |
| 5,953,468 A | 9/1999 | Finnila et al. | 6,150,239 A | 11/2000 | Goesele et al. |
| 5,955,591 A | 9/1999 | Imbach et al. | 6,153,010 A | 11/2000 | Kiyoku et al. |
| 5,959,308 A | 9/1999 | Shichijo et al. | 6,153,454 A | 11/2000 | Krivokapic |
| 5,959,879 A | 9/1999 | Koo | 6,156,581 A | 12/2000 | Vaudo et al. |
| 5,962,069 A | 10/1999 | Schindler et al. | 6,173,474 B1 | 1/2001 | Conrad |
| 5,963,291 A | 10/1999 | Wu et al. | 6,174,755 B1 | 1/2001 | Manning |
| 5,966,323 A | 10/1999 | Chen et al. | 6,175,497 B1 | 1/2001 | Tseng et al. |
| 5,976,953 A | 11/1999 | Zavracky et al. | 6,175,555 B1 | 1/2001 | Hoole |
| 5,977,567 A | 11/1999 | Verdiell | 6,180,252 B1 | 1/2001 | Farrell et al. |
| 5,981,400 A | 11/1999 | Lo | 6,180,486 B1 | 1/2001 | Leobandung et al. |
| 5,981,976 A | 11/1999 | Murasato | 6,184,044 B1 | 2/2001 | Sone et al. |
| 5,981,980 A | 11/1999 | Miyajima et al. | 6,184,144 B1 | 2/2001 | Lo |
| 5,984,190 A | 11/1999 | Nevill | 6,191,011 B1 | 2/2001 | Gilboa et al. |
| 5,987,011 A | 11/1999 | Toh | 6,194,753 B1 | 2/2001 | Seon et al. |
| 5,987,196 A | 11/1999 | Noble | 6,197,503 B1 | 3/2001 | Vo-Dinh et al. |
| 5,990,495 A | 11/1999 | Ohba | 6,198,119 B1 | 3/2001 | Nabatame et al. |
| 5,995,359 A | 11/1999 | Klee et al. | 6,204,737 B1 | 3/2001 | Ella |
| 5,995,528 A | 11/1999 | Fukunaga et al. | 6,208,453 B1 | 3/2001 | Wessels et al. |
| 5,998,781 A | 12/1999 | Vawter et al. | 6,210,988 B1 | 4/2001 | Howe et al. |
| 5,998,819 A | 12/1999 | Yokoyama et al. | 6,211,096 B1 | 4/2001 | Allman et al. |

| | | | | | | |
|---|---|---|---|---|---|---|
| 6,222,654 B1 | 4/2001 | Frigo | | 2001/0020278 A1 | 9/2001 | Saito |
| 6,224,669 B1 | 5/2001 | Yi et al. | | 2001/0036142 A1 | 11/2001 | Kadowaki et al. |
| 6,225,051 B1 | 5/2001 | Sugiyama et al. | | 2002/0006245 A1 | 1/2002 | Kubota et al. |
| 6,229,159 B1 | 5/2001 | Suzuki | | 2002/0008234 A1 | 1/2002 | Emrick |
| 6,232,910 B1 | 5/2001 | Bell et al. | | 2002/0030246 A1 | 3/2002 | Eisenbeiser et al. |
| 6,233,649 B1 | 5/2001 | Hirayama et al. | | 2002/0047123 A1 | 4/2002 | Ramdani et al. |
| 6,235,145 B1 | 5/2001 | Li et al. | | 2002/0047143 A1 | 4/2002 | Ramdani et al. |
| 6,238,946 B1 | 5/2001 | Ziegler | | 2002/0072245 A1 | 6/2002 | Ooms et al. |
| 6,239,012 B1 | 5/2001 | Kinsman | | 2002/0079576 A1 | 6/2002 | Seshan |
| 6,239,449 B1 | 5/2001 | Fafard et al. | | 2002/0131675 A1 | 9/2002 | Litvin |
| 6,241,821 B1 | 6/2001 | Yu et al. | | 2002/0140012 A1 | 10/2002 | Droopad |
| 6,242,686 B1 | 6/2001 | Kishimoto et al. | | 2002/0145168 A1 | 10/2002 | Bojarczuk, Jr. et al. |
| 6,248,459 B1 | 6/2001 | Wang et al. | | 2002/0195610 A1 | 12/2002 | Klosowiak |
| 6,248,621 B1 | 6/2001 | Wilk et al. | | | | |
| 6,252,261 B1 | 6/2001 | Usui et al. | | FOREIGN PATENT DOCUMENTS | | |
| 6,255,198 B1 | 7/2001 | Linthicum et al. | EP | 0 309 270 | 3/1989 | |
| 6,256,426 B1 | 7/2001 | Duchet | EP | 0 331 338 | 9/1989 | |
| 6,265,749 B1 | 7/2001 | Gardner et al. | EP | 0 331 467 | 9/1989 | |
| 6,268,269 B1 | 7/2001 | Lee et al. | EP | 0 342 937 | 11/1989 | |
| 6,271,619 B1 | 8/2001 | Yamada et al. | EP | 0 412 002 | 2/1991 | |
| 6,275,122 B1 | 8/2001 | Speidell et al. | EP | 0 455 526 | 6/1991 | |
| 6,277,436 B1 | 8/2001 | Stauf et al. | EP | 0 483 993 | 5/1992 | |
| 6,278,137 B1 | 8/2001 | Shimoyama et al. | EP | 0 514 018 | 11/1992 | |
| 6,278,138 B1 | 8/2001 | Suzuki | EP | 0 538 611 | 4/1993 | |
| 6,278,523 B1 | 8/2001 | Gorecki | EP | 0 581 239 | 2/1994 | |
| 6,291,319 B1 | 9/2001 | Yu et al. | EP | 0 600 658 | 6/1994 | |
| 6,297,598 B1 | 10/2001 | Wang et al. | EP | 0 602 568 | 6/1994 | |
| 6,297,842 B1 | 10/2001 | Koizumi et al. | EP | 0 607 435 | 7/1994 | |
| 6,300,615 B1 | 10/2001 | Shinohara et al. | EP | 0 614 256 | 9/1994 | |
| 6,306,668 B1 | 10/2001 | McKee et al. | EP | 0 619 283 | 10/1994 | |
| 6,307,996 B1 | 10/2001 | Nashimoto et al. | EP | 0 630 057 | 12/1994 | |
| 6,312,819 B1 | 11/2001 | Jia et al. | EP | 0 661 561 | 7/1995 | |
| 6,313,486 B1 | 11/2001 | Kencke et al. | EP | 0 860 913 | 8/1995 | |
| 6,316,785 B1 | 11/2001 | Nunoue et al. | EP | 0 682 266 | 11/1995 | |
| 6,316,832 B1 | 11/2001 | Tsuzuki et al. | EP | 0 711 853 | 5/1996 | |
| 6,319,730 B1 | 11/2001 | Ramdani et al. | EP | 0 777 379 | 6/1997 | |
| 6,320,238 B1 | 11/2001 | Kizilyalli et al. | EP | 0 810 666 | 12/1997 | |
| 6,326,637 B1 | 12/2001 | Parkin et al. | EP | 0 852 416 | 7/1998 | |
| 6,326,645 B1 | 12/2001 | Kadota | EP | 0 875 922 | 11/1998 | |
| 6,338,756 B2 | 1/2002 | Dietze | EP | 0 881 669 | 12/1998 | |
| 6,339,664 B1 | 1/2002 | Farjady et al. | EP | 0 884 767 | 12/1998 | |
| 6,340,788 B1 | 1/2002 | King et al. | EP | 0 926 739 | 6/1999 | |
| 6,343,171 B1 | 1/2002 | Yoshimura et al. | EP | 0 957 522 | 11/1999 | |
| 6,345,424 B1 | 2/2002 | Hasegawa et al. | EP | 0 964 259 | 12/1999 | |
| 6,348,373 B1 | 2/2002 | Ma et al. | EP | 0 964 453 | 12/1999 | |
| 6,359,330 B1 | 3/2002 | Goudard | EP | 0 993 027 | 4/2000 | |
| 6,362,017 B1 | 3/2002 | Manabe et al. | EP | 0 999 600 | 5/2000 | |
| 6,367,699 B2 | 4/2002 | Ackley | EP | 1 001 468 | 5/2000 | |
| 6,372,356 B1 | 4/2002 | Thornton et al. | EP | 1 035 759 | 9/2000 | |
| 6,372,813 B1 | 4/2002 | Johnson et al. | EP | 1 043 426 | 10/2000 | |
| 6,376,337 B1 | 4/2002 | Wang et al. | EP | 1 043 765 | 10/2000 | |
| 6,389,209 B1 | 5/2002 | Suhir | EP | 1 054 442 | 11/2000 | |
| 6,391,674 B2 | 5/2002 | Ziegler | EP | 1 069 606 | 1/2001 | |
| 6,392,253 B1 | 5/2002 | Saxena | EP | 1 085 319 | 3/2001 | |
| 6,392,257 B1 | 5/2002 | Ramdani et al. | EP | 1 089 338 | 4/2001 | |
| 6,393,167 B1 | 5/2002 | Davis et al. | EP | 1 109 212 | 6/2001 | |
| 6,404,027 B1 | 6/2002 | Hong et al. | FR | 2 779 843 | 12/1999 | |
| 6,410,941 B1 | 6/2002 | Taylor et al. | GB | 1 319 311 | 6/1970 | |
| 6,410,947 B1 | 6/2002 | Wada | GB | 2 335 792 | 9/1999 | |
| 6,411,756 B2 | 6/2002 | Sadot et al. | JP | 52-88354 | 7/1977 | |
| 6,417,059 B2 | 7/2002 | Huang | JP | 52-89070 | 7/1977 | |
| 6,427,066 B1 | 7/2002 | Grube | JP | 52089070 A * | 7/1977 | ........... H01L/21/20 |
| 6,432,546 B1 | 8/2002 | Ramesh et al. | JP | 52-135684 | 11/1977 | |
| 6,438,281 B1 | 8/2002 | Tsukamoto et al. | JP | 54-134554 | 10/1979 | |
| 6,452,232 B1 | 9/2002 | Adan | JP | 55-87424 | 7/1980 | |
| 6,461,927 B1 | 10/2002 | Mochizuki et al. | JP | 58-075868 | 5/1983 | |
| 6,462,360 B1 | 10/2002 | Higgins, Jr. et al. | JP | 58-213412 | 12/1983 | |
| 6,477,285 B1 | 11/2002 | Shanley | JP | 60-210018 | 10/1985 | |
| 6,496,469 B1 | 12/2002 | Uchizaki | JP | 60-212018 | 10/1985 | |
| 6,504,189 B1 | 1/2003 | Matsuda et al. | JP | 61-36981 | 2/1986 | |
| 2001/0013313 A1 | 8/2001 | Droopad et al. | JP | 61-603015 | 4/1986 | |

| | | |
|---|---|---|
| JP | 61-108187 | 5/1986 |
| JP | 62-245205 | 10/1987 |
| JP | 63-34994 | 2/1988 |
| JP | 63-131104 | 6/1988 |
| JP | 63-198365 | 8/1988 |
| JP | 63-289812 | 11/1988 |
| JP | 64-50575 | 2/1989 |
| JP | 64-52329 | 2/1989 |
| JP | 1-102435 | 4/1989 |
| JP | 1-179411 | 7/1989 |
| JP | 01-196809 | 8/1989 |
| JP | 03-149882 | 11/1989 |
| JP | HEI 2-391 | 1/1990 |
| JP | 02051220 | 2/1990 |
| JP | 3-171617 | 7/1991 |
| JP | 03-188619 | 8/1991 |
| JP | 5-48072 | 2/1993 |
| JP | 5-086477 | 4/1993 |
| JP | 05150143 | 6/1993 |
| JP | 5-152529 | 6/1993 |
| JP | 05 221800 | 8/1993 |
| JP | 5-232307 | 9/1993 |
| JP | 5-243525 | 9/1993 |
| JP | 5-291299 | 11/1993 |
| JP | 06-069490 | 3/1994 |
| JP | 6-232126 | 8/1994 |
| JP | 6-291299 | 10/1994 |
| JP | 6-334168 | 12/1994 |
| JP | 0812494 | 1/1996 |
| JP | 9-67193 | 3/1997 |
| JP | 9-82913 | 3/1997 |
| JP | 10-256154 | 9/1998 |
| JP | 10-303396 | 11/1998 |
| JP | 10-321943 | 12/1998 |
| JP | 3-41783 | 2/1999 |
| JP | 11135614 | 5/1999 |
| JP | 11-238683 | 8/1999 |
| JP | 11-260835 | 9/1999 |
| JP | 01 294594 | 11/1999 |
| JP | 11340542 | 12/1999 |
| JP | 2000-068466 | 3/2000 |
| JP | 2 000 1645 | 6/2000 |
| JP | 2000-349278 | 12/2000 |
| JP | 2000-351692 | 12/2000 |
| JP | 2002-9366 | 1/2002 |
| WO | WO 92/10875 | 6/1992 |
| WO | WO 93/07647 | 4/1993 |
| WO | WO 94/03908 | 1/1994 |
| WO | WO 97/45827 | 12/1997 |
| WO | WO 98/05807 | 1/1998 |
| WO | WO 98/20606 | 5/1998 |
| WO | WO 99/14797 | 3/1999 |
| WO | WO 99/14804 | 3/1999 |
| WO | WO 99/19546 | 4/1999 |
| WO | WO 99/63580 | 12/1999 |
| WO | WO 00/06812 | 2/2000 |
| WO | WO 00/16378 | 3/2000 |
| WO | WO 00/33363 | 6/2000 |
| WO | WO 00/48239 | 8/2000 |
| WO | WO 01/04943 A1 | 1/2001 |
| WO | WO 01/16395 | 3/2001 |
| WO | WO 01/33585 | 5/2001 |
| WO | WO 01/37330 | 5/2001 |
| WO | WO 01/59814 A2 | 8/2001 |
| WO | WO 01/59820 A1 | 8/2001 |
| WO | WO 01/59821 A1 | 8/2001 |
| WO | WO 01/59837 | 8/2001 |
| WO | WO 02 01648 | 1/2002 |
| WO | WO 02/03113 | 1/2002 |
| WO | WO 02/03467 | 1/2002 |
| WO | WO 02/03480 | 1/2002 |
| WO | WO 02/08806 | 1/2002 |
| WO | WO 02/09160 A2 | 1/2002 |
| WO | WO 02/33385 A2 | 4/2002 |
| WO | WO 02/47127 A2 | 6/2002 |
| WO | WO 02/50879 | 6/2002 |

OTHER PUBLICATIONS

Chyuan–Wei Chen et al;"Liquid–phase epitaxial growth and characterization of InGaAsP layers grown on GaAsP substrates for application to orange light–emitting diodes"; 931 Journal of Applied Physics; 77 Jan. 15, 1995, No. 2; Woodbury, NY, US; pp. 905–909.

W. Zhu et al.; "Oriented diamond films grown on nickel substrates"; 320 Applied Physics Letters; 63 Sep. 1993, No. 12, Woodbury, NY, US; pp. 1640–1642.

M. Schreck et al.; "Diamomd/Ir/SrTi03: A material combination for improved heteroepitaxial diamond films"; Applied Physics Letters; vol. 74, No. 5, Feb. 1, 1999; pp. 650–652.

Yoshihiro Yokota et al.; "Cathodoluminescence of boron––doped heteroepitaxial diamond films on platinum"; Diamond and Related Materials 8(1999); pp. 1587–1591.

J.R. Busch et al.; "LINEAR ELECTRO–OPTIC RESPONSE IN SOL–GEL PZT PLANAR WAVEGUIDE"; Electronics Letters; Aug. 13, 1992; vol. 28, No. 17; pp. 1591–1592.

R. Droopad et al.; "Epitaxial Oxide Films on Silicon; Growth, Modeling and Device Properties"; Mat. Res. Soc. Symp. Proc. vol. 619; 2000 Materials Research Society; pp. 155–165.

H. Ohkubo et al.; "Fabrication of High Quality Perovskite Oxide Films by Lateral Epitaxy Verified with RHEED Oscillation";2419A Int. Conf. on Solid State Devices & Materials, Tsukuba, Aug. 26–28, 1998; pp. 457–459.

Lin Li; "Ferroelectric/Superconductor Heterostructures"; Materials Science and Engineering; 29 (2000) pp. 153–181.

L. Fan et al.; "Dynamic Beam Switching of Vertical–Cavity Surface–Emitting Lasers with Integrated Optical Beam Routers"; IEEE Photonics Technology Letters; vol. 9, No. 4; Apr. 4, 1997; pp. 505–507.

Y. Q. Xu et al.; "(Mn, Sb) dropped –Pb(Zr,Ti)03 infrared detector arrays"; Journal of Applied Physics; vol. 88, No. 2; Jul. 15, 2000; pp. 1004–1007.

Kiyoko Kato et al.; "Reduction of dislocations in InGaAs layer GaAs using expitaxial lateral overgrowth"; 2300 Journal of Crystal Growth 115 (1991) pp. 174–179; Dec. 1991.

* cited by examiner

STRUCTURE AND METHOD FOR FABRICATING EPITAXIAL SEMICONDUCTOR ON INSULATOR (SOI) STRUCTURES AND DEVICES UTILIZING THE FORMATION OF A COMPLIANT SUBSTRATE FOR MATERIALS USED TO FORM SAME

FIELD OF THE INVENTION

This invention relates generally to semiconductor structures and devices and to a method for their fabrication, and more specifically to semiconductor on insulator (SOI) structures and devices and to the fabrication and use of SOI structures, devices, and integrated circuits that include a monocrystalline material layer comprised of semiconductor material, and/or other types of material such as metals and non-metals.

BACKGROUND OF THE INVENTION

Semiconductor devices often include multiple layers of conductive, insulating, and semiconductive layers. Often, the desirable properties of such layers improve with the crystallinity of the layer. For example, the electron mobility and band gap of semiconductive layers improves as the crystallinity of the layer increases. Similarly, the free electron concentration of conductive layers and the electron charge displacement and electron energy recoverability of insulative or dielectric films improves as the crystallinity of these layers increases.

For many years, attempts have been made to grow various monolithic thin films on a foreign substrate such as silicon (Si). To achieve optimal characteristics of the various monolithic layers, however, a monocrystalline film of high crystalline quality is desired. Attempts have been made, for example, to grow various monocrystalline layers on a substrate such as germanium, silicon, and various insulators. These attempts have generally been unsuccessful because lattice mismatches between the host crystal and the grown crystal have caused the resulting layer of monocrystalline material to be of low crystalline quality.

If a large area thin film of high quality monocrystalline material was available at low cost, a variety of semiconductor devices could advantageously be fabricated in or using that film at a low cost compared to the cost of fabricating such devices beginning with a bulk wafer of semiconductor material or in an epitaxial film of such material on a bulk wafer of semiconductor material. In addition, if a thin film of high quality monocrystalline material could be realized beginning with a bulk wafer such as a silicon wafer, an integrated device structure could be achieved that took advantage of the best properties of both the silicon and the high quality monocrystalline material.

Accordingly, a need exists for a semiconductor structure that provides a high quality monocrystalline film or layer over another monocrystalline material and for a process for making such a structure. In other words, there is a need for providing the formation of a monocrystalline substrate that is compliant with a high quality monocrystalline material layer so that true two-dimensional growth can be achieved for the formation of quality semiconductor structures, devices and integrated circuits having grown monocrystalline film having the same crystal orientation as an underlying substrate. This monocrystalline material layer may be comprised of a semiconductor material, and other types of material such as metals and non-metals.

BRIEF DESCRIPTION OF THE DRAWINGS

The present invention is illustrated by way of example and not limitation in the accompanying drawing figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
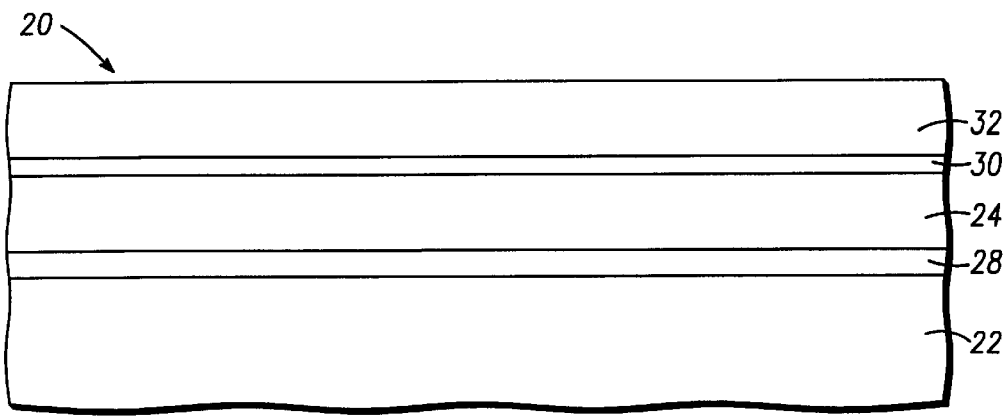
FIGS. 1, 2, and 3 illustrate schematically, in cross section, device structures in accordance with various embodiments of the invention.

FIG. 1 illustrates schematically, in cross section, a portion of a semiconductor structure 20 in accordance with an embodiment of the invention. Semiconductor structure 20 includes a monocrystalline substrate 22, accommodating buffer layer 24 comprising a monocrystalline material, and a monocrystalline material layer 26. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

In accordance with one embodiment of the invention, structure 20 also includes an amorphous intermediate layer 28 positioned between substrate 22 and accommodating buffer layer 24. Structure 20 may also include a template layer 30 between the accommodating buffer layer and monocrystalline material layer 26. As will be explained more fully below, the template layer helps to initiate the growth of the monocrystalline material layer on the accommodating buffer layer. The amorphous intermediate layer helps to relieve the strain in the accommodating buffer layer and by doing so, aids in the growth of a high crystalline quality accommodating buffer layer.

Substrate 22, in accordance with an embodiment of the invention, is a monocrystalline semiconductor wafer, preferably of large diameter. The wafer can be of, for example, a material from Group IV of the periodic table. Examples of Group IV semiconductor materials include silicon, germanium, mixed silicon and germanium, mixed silicon and carbon, mixed silicon, germanium and carbon, and the like. Preferably substrate 22 is a wafer containing silicon or germanium, and most preferably is a high quality monocrystalline silicon wafer as used in the semiconductor industry. Accommodating buffer layer 24 is preferably a monocrystalline oxide or nitride material epitaxially grown on the underlying substrate. In accordance with one embodiment of the invention, amorphous intermediate layer 28 is grown on substrate 22 at the interface between substrate 22 and the growing accommodating buffer layer by the oxidation of substrate 22 during the growth of layer 24. The amorphous intermediate layer serves to relieve strain that might otherwise occur in the monocrystalline accommodating buffer layer as a result of differences in the lattice constants of the substrate and the buffer layer. As used herein, lattice constant refers to the distance between atoms of a cell measured in the plane of the surface. If such strain is not relieved by the amorphous intermediate layer, the strain may cause defects in the crystalline structure of the accommodating buffer layer. Defects in the crystalline structure of the accommodating buffer layer, in turn, would make it difficult to achieve a high quality crystalline structure in monocrystalline material layer 26 which may comprise a semiconductor material, or another type of material such as a metal or a non-metal.

Accommodating buffer layer 24 is preferably a monocrystalline oxide or nitride material selected for its crystalline compatibility with the underlying substrate and with the overlying material layer. For example, the material could be an oxide or nitride having a lattice structure closely matched to the substrate and to the subsequently applied monocrystalline material layer. Materials that are suitable for the accommodating buffer layer include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, and gadolinium oxide. Additionally, various nitrides such as gallium nitride, aluminum nitride, and boron nitride may also be used for the accommodating buffer layer. Most of these materials are insulators, although strontium ruthenate, for example, is a conductor. Generally, these materials are metal oxides or metal nitrides, and more particularly, these metal oxide or nitrides typically include at least two different metallic elements. In some specific applications, the metal oxides or nitrides may include three or more different metallic elements.

In accordance with one embodiment of the present invention, accommodating buffer layer 24 is a material having the empirical formula $ABO_x$, wherein A is magnesium (Mg), calcium (Ca), strontium (Sr), barium (Ba), or a combination of two or more of these, and B is titanium (Ti), zirconium (Zr), hafnium (Hf), or a combination of two or more of these. The composition of accommodating buffer layer 24 preferably is chosen such that it is at least partially, and preferably substantially, lattice matched to the overlying material layer.

Amorphous interface layer 28 is preferably an oxide formed by the oxidation of the surface of substrate 22, and more preferably is composed of a silicon oxide. The thickness of layer 28 is sufficient to relieve strain attributed to mismatches between the lattice constants of substrate 22 and accommodating buffer layer 24. Typically, layer 28 has a thickness in the range of approximately 0.5–5 nm.

In general, layer 32 provides a transition in lattice constants between the lattice constant of accommodating buffer layer 24 and a subsequently deposited layer of monocrystalline material overlying graded layer 32. More particularly, the material for layer 32 is selected such that the lattice constant of layer 32 can be altered by changing the composition of layer 32, such that a bottom portion of layer 32 is lattice matched to accommodating buffer layer 24 and a top portion of layer 32 is lattice matched to the subsequently applied layer of monocrystalline material.

The material for graded monocrystalline layer 32 can be selected, as desired, for a particular structure or application. For example, the monocrystalline material of layer 32 may comprise a mixed Group IV semiconductor, where the lattice constant of the material is altered as a function of thickness of the film by varying the ratio of components in the film. In accordance with one embodiment of the invention, layer 32 comprises $Si_yGe_{1-y}$ (y ranges from 0 to 1) where the concentration of germanium is low (i. e., 0%) near the surface of template 30 and high (i e., 100%) near the top of layer 32. In this case, the lower surface of layer 32 is closely lattice matched to material comprising accommodating buffer layer 24, whereas the top of layer 32 is lattice matched to germanium. In accordance with another embodiment of the invention, layer 32 comprises germanium, which is closely lattice matched to the material comprising accommodating buffer layer 24 (such as, for example, $SrTiO_3$). As used herein, the term "graded" may refer to monocrystalline layers comprising more than one semiconductor component in which the lattice constant of the monocrystalline material is altered as a function of thickness in the film by varying the components in the film (e.g., $Si_yGe_{1-y}$ or SiC). Thus, structure 20 provides a suitable substrate for subsequent growth of monocrystalline material having a lattice constant that differs from the lattice constants of materials of either substrate 22 or accommodating buffer layer 24.

Appropriate materials for template 30 are discussed below. Suitable template materials chemically bond to the surface of the accommodating buffer layer 24 at selected sites and provide sites for the nucleation of the epitaxial growth of graded monocrystalline layer 32. When used, template layer 30 has a thickness ranging form about 1 to about 10 monolayers.

Figure 2:

FIG. 2 illustrates, in cross section, a portion of a semiconductor structure 40 in accordance with a further embodiment of the invention. Structure 40 is similar to the previously described semiconductor structure 20, except that an additional layer of monocrystalline material 26 is formed over graded layer 32. Layer 26 material may include insulating, semiconducting, or conducting materials. For example, layer 26 may include semiconductor materials such as Group IV materials; conducting materials such as metals; and insulating material such as oxides.

Figure 3:
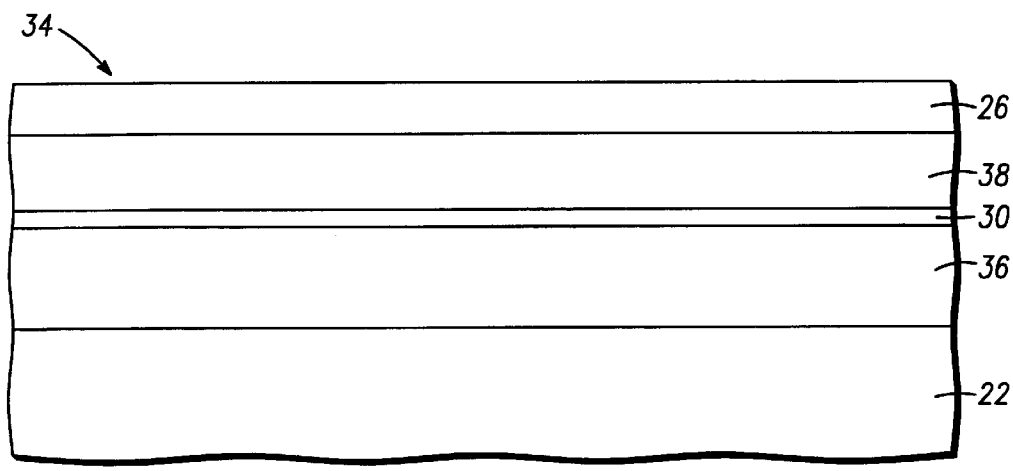

FIG. 3 schematically illustrates, in cross section, a portion of a semiconductor structure 34 in accordance with another exemplary embodiment of the invention. Structure 34 is similar to structure 20, except that structure 34 includes an amorphous layer 36, rather than accommodating buffer layer 24 and amorphous interface layer 28, and an additional monocrystalline layer 38.

As explained in greater detail below, amorphous layer 36 may be formed by first forming an accommodating buffer layer and an amorphous interface layer in a similar manner to that described above. Monocrystalline layer 38 is then formed (by epitaxial growth) overlying the monocrystalline accommodating buffer layer. The accommodating buffer layer is then exposed to an anneal process to convert the monocrystalline accommodating buffer layer to an amorphous layer. Amorphous layer 36 formed in this manner comprises materials from both the accommodating buffer and interface layers, which amorphous layers may or may not amalgamate. Thus, layer 36 may comprise one or two amorphous layers. Formation of amorphous layer 36 between substrate 22 and additional monocrystalline layer 26 (subsequent to layer 38 formation) relieves stresses between layers 22 and 38 and provides a true compliant substrate for subsequent processing—e.g., monocrystalline material layer 26 formation.

The processes previously described above in connection with FIGS. 1 and 2 are adequate for growing monocrystalline material layers over a monocrystalline substrate. However, the process described in connection with FIG. 3, which includes transforming a monocrystalline accommodating buffer layer to an amorphous oxide layer, may be better for growing monocrystalline material layers because it allows any strain in layer 26 to relax.

Additional monocrystalline layer 38 may include any of the materials described throughout this application in connection with either of monocrystalline material layer 26 or additional buffer layer 32. For example, when monocrystalline material layer 26 comprises a semiconductor material, layer 38 may include monocrystalline Group IV materials.

In accordance with one embodiment of the present invention, additional monocrystalline layer 38 serves as an anneal cap during layer 36 formation and as a template for subsequent monocrystalline layer 26 formation. Accordingly, layer 38 is preferably thick enough to provide a suitable template for layer 26 growth (at least one monolayer) and thin enough to allow layer 38 to form as a substantially defect free monocrystalline material.

In accordance with another embodiment of the invention, additional monocrystalline layer 38 comprises monocrystalline material (e.g., a material discussed above in connection with monocrystalline layer 26) that is thick enough to form devices within layer 38. In this case, a semiconductor structure in accordance with the present invention does not include monocrystalline material layer 26. In other words, the semiconductor structure in accordance with this embodiment only includes one monocrystalline layer disposed above amorphous oxide layer 36.

The following non-limiting, illustrative examples illustrate various combinations of materials useful in structures 20, 40, and 34 in accordance with various alternative embodiments of the invention. These examples are merely illustrative, and it is not intended that the invention be limited to these illustrative examples.

EXAMPLE 1

In accordance with one embodiment of the invention, monocrystalline substrate 22 is a silicon substrate oriented in the (100) direction. The silicon substrate can be, for example, a silicon substrate as is commonly used in making complementary metal oxide semiconductor (CMOS) integrated circuits having a diameter of about 200–300 mm. In accordance with this embodiment of the invention, accommodating buffer layer 24 is a monocrystalline layer of $Ca_zSr_{1-z}TiO_3$ where z ranges from 0 to 1 and the amorphous intermediate layer is a layer of silicon oxide ($SiO_x$) formed at the interface between the silicon substrate and the accommodating buffer layer. The value of z is selected to obtain one or more lattice constants closely matched to corresponding lattice constants of the subsequently formed layer 32. The accommodating buffer layer can have a thickness of about 2 to about 100 nanometers (nm) and preferably has a thickness of about 5 nm. In general, it is desired to have an accommodating buffer layer thick enough to isolate the graded layer from the substrate. Layers thicker than 100 nm usually provide little additional benefit while increasing cost unnecessarily; however, thicker layers may be fabricated if needed. The amorphous intermediate layer of silicon oxide can have a thickness of about 0.5–5 nm, and preferably a thickness of about 1 to 2 nm.

In accordance with this embodiment of the invention, monocrystalline layer 32 is a Group IV semiconductor layer comprising $Si_yGe_{1-y}$, where y ranges from 0 to 1 having a thickness of about 1 nm to about 100 μm, preferably a thickness of about 0.1 μm to 10 μm, and more preferably about 0.1 to 5 μm. The thickness generally depends on the subsequently deposited material (e.g., layer 26 of FIGS. 2–3). The compositions of other compound semiconductor materials, such as those listed above, may also be similarly varied to manipulate the lattice constant of layer 32 in a like manner. To facilitate the epitaxial growth of the graded layer on the monocrystalline oxide, a template layer is formed by capping the oxide layer. The template layer is preferably 1–10 monolayers of Sr—Si, $SiO_x$, Sr—Si—O, Ti—Si, Ti—Ge, Sr—Ge—O, Sr—Ge, $GeO_x$.

EXAMPLE 2

In accordance with a further embodiment of the invention, monocrystalline substrate 22 is a silicon substrate as described above. The accommodating buffer layer is a monocrystalline oxide of strontium or barium zirconate or hafnate in a cubic or orthorhombic phase with an amorphous intermediate layer of silicon oxide formed at the interface between the silicon substrate and the accommodating buffer layer. The accommodating buffer layer can have a thickness of about 2–100 nm and preferably has a thickness of at least 5 nm to ensure adequate crystalline and surface quality and is formed of a monocrystalline $SrZrO_3$, $BaZrO_3$, $SrTiO_3$, or $BaTiO_3$. For example, a monocrystalline oxide layer of $Sr(Zr,Ti)O_3$ can grow at a temperature of about 700° C. The lattice structure of the resulting crystalline oxide exhibits a 45 degree rotation with respect to the substrate silicon lattice structure.

An accommodating buffer layer formed of these zirconate or titanate materials is suitable for the growth of a monocrystalline material layer which comprises semiconductor materials such as germanium (Ge), having a thickness of about 1.0 nm to 10 μm. A suitable template for this structure is 1–10 monolayers of Ti—Ge, Sr—Ge—O, Sr—Ge, or $GeO_x$, and preferably 1–2 monolayers of one of these materials. By way of an example, for a $Sr(Zr,Ti)O_3$ accommodating buffer layer, the surface is terminated with 1–2 monolayers of titanium followed by deposition of 1–2 monolayers of germanium to form a Ti—Ge template. A monocrystalline layer of germanium is then grown on the template layer. The resulting lattice structure of the semiconductor material exhibits a 45 degree rotation with respect to the accommodating buffer layer lattice structure and a lattice mismatch to (100) Ge of less than 2.5%, and preferably less than about 1.0%.

EXAMPLE 3

This example also illustrates materials useful in a structure 40 as illustrated in FIG. 2. Substrate material 22, accommodating buffer layer 24, monocrystalline graded layer 32 and template layer 30 can be the same as those described above in Example 1. In accordance with one aspect of this embodiment, layer 32 includes $Si_yGe_{1-y}$, in which the silicon composition varies from 0 to about 50%. The buffer layer preferably has a thickness of about 10–30 nm. Varying the composition of layer 32 from SiGe to Ge serves to provide a lattice match between the underlying monocrystalline oxide material and the overlying layer of monocrystalline material which in this Example is a Ge layer.

EXAMPLE 4

This example provides exemplary materials useful in structure 34, as illustrated in FIG. 3. Substrate material 22, template layer 30, and monocrystalline material layer 26 may be the same as those described above in connection with Example 4.

Amorphous layer 36 is an amorphous layer which is suitably formed of a combination of amorphous intermediate layer materials (e.g., layer 28 materials as described above) and accommodating buffer layer materials (e.g., layer 24 materials as described above). For example, amorphous layer 36 may include a combination of $SiO_x$, $Sr_zBa_{1-z}TiO_3$ (where z ranges from 0 to 1), and Si which combine or mix, at least partially, during an anneal process to form amorphous layer 36.

The thickness of amorphous layer 36 may vary from application to application and may depend on such factors as desired insulating properties of layer 36, type of monocrystalline material comprising layer 26, and the like. In accordance with one exemplary aspect of the present embodiment, layer 36 thickness is about 2 nm to about 100 nm, preferably about 2–10 nm, and more preferably about 5–6 nm.

Layer 38 comprises a monocrystalline material that can be grown epitaxially over a monocrystalline material such as material used to form accommodating buffer layer 24. In accordance with one embodiment of the invention, layer 38 includes the same materials as those comprising layer 26. For example, if layer 26 includes SiGe, layer 38 also includes SiGe. However, in accordance with other embodiments of the present invention, layer 38 includes materials different from those used to form layer 26. In accordance with one exemplary embodiment of the invention, layer 38 comprises silicon and is about 1 monolayer to about 100 nm thick.

Referring again to FIGS. 1–3, substrate 22 is a monocrystalline substrate such as a monocrystalline silicon substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of the accommodating buffer layer and the monocrystalline substrate must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

Figure 4:
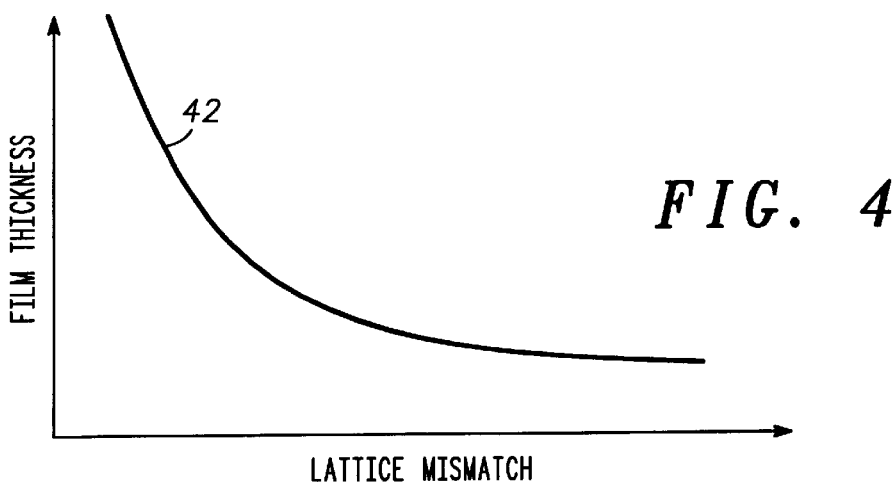
FIG. 4 illustrates graphically the relationship between maximum attainable film thickness and lattice mismatch between a host crystal and a grown crystalline overlayer.

FIG. 4 illustrates graphically the relationship of the achievable thickness of a grown crystal layer of high crystalline quality as a function of the mismatch between the lattice constants of the host crystal and the grown crystal. Curve 42 illustrates the boundary of high crystalline quality material. The area to the right of curve 42 represents layers that have a large number of defects. With no lattice mismatch, it is theoretically possible to grow an infinitely thick, high quality epitaxial layer on the host crystal. As the mismatch in lattice constants increases, the thickness of achievable, high quality crystalline layer decreases rapidly. As a reference point, for example, if the lattice constants between the host crystal and the grown layer are mismatched by more than about 2%, monocrystalline epitaxial layers in excess of about 20 nm cannot be achieved.

In accordance with one embodiment of the invention, substrate 22 is a (100) or (111) oriented monocrystalline silicon wafer and accommodating buffer layer 24 is a layer of calcium strontium titanate. Substantial matching of lattice constants between these two materials is achieved by rotating the crystal orientation of the titanate material by 45° with respect to the crystal orientation of the silicon substrate wafer. The inclusion in the structure of amorphous interface layer 28, a silicon oxide layer in this example, if it is of sufficient thickness, serves to reduce strain in the titanate monocrystalline layer that might result from any mismatch in the lattice constants of the host silicon wafer and the grown titanate layer. As a result, in accordance with an embodiment of the invention, a high quality, thick, monocrystalline titanate layer is achievable.

Referring to FIGS. 2–3, layer 26 is a layer of epitaxially grown monocrystalline material and that crystalline material is also characterized by a crystal lattice constant and a crystal orientation. In accordance with one embodiment of the invention, the lattice constant of layer 26 differs from the lattice constant of substrate 22. To achieve high crystalline quality in this epitaxially grown monocrystalline layer 32, the accommodating buffer layer must be of high crystalline quality. In addition, in order to achieve high crystalline quality in layer 26, substantial matching between the crystal lattice constant of the host crystal, in this case, the monocrystalline layer, and the grown crystal is desired. With properly selected materials this substantial matching of lattice constants is achieved as a result of changing the lattice constant of layer 32 by varying the composition of layer 32. For example, if the grown crystal is SiGe and the accommodating buffer layer is monocrystalline $Ca_zSr_{1-z}TiO_3$, substantial matching of crystal lattice constants of the two materials is achieved by varying a composition of a $Si_yGe_{1-y}$ layer 32 from silicon to silicon-germanium. Crystalline layer 32 between the oxide and the grown monocrystalline material layer reduces strain in the grown monocrystalline material layer that might result from small differences in lattice constants. Better crystalline quality in the grown monocrystalline material layer can thereby be achieved. Furthermore, layer 32 facilitates confinement of crystal defects at or near the interface of layers 32 and 36 and away from layer 26.

The following example illustrates a process, in accordance with one embodiment of the invention, for fabricating a semiconductor structure such as the structures depicted in FIGS. 1–3. The process starts by providing a monocrystalline semiconductor substrate comprising silicon or germanium. In accordance with a preferred embodiment of the invention, the semiconductor substrate is a silicon wafer having a (100) orientation. The substrate is preferably oriented on axis or, at most, about five degrees off axis. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. In order to epitaxially grow a monocrystalline oxide layer overlying the monocrystalline substrate, the native oxide layer must first be removed to expose the crystal line structure of the underlying substrate. The following process is preferably carried out by molecular beam epitaxy (MBE), although other epitaxial processes may also be used in accordance with the present invention. The native oxide can be removed by first thermally depositing a thin layer of strontium, barium, a combination of strontium and barium, or other alkaline earth metals or combinations of alkaline earth metals in an MBE apparatus. In the case where strontium is used, the substrate is then heated to a temperature of about 750° C. to cause the strontium to react with the native silicon oxide layer. The strontium serves to reduce the silicon oxide to leave a silicon oxide-free surface. The resultant surface may exhibit an ordered 2×1 structure. If such an ordered 2×1 structure has not been achieved, the structure may be exposed to additional strontium until an ordered 2×1 structure is obtained. The ordered 2×1 structure forms a template for the ordered growth of an overlying layer of a monocrystalline oxide. The template provides the necessary chemical and physical properties to nucleate the crystalline growth of an overlying layer.

In accordance with an alternate embodiment of the invention, the native silicon oxide can be converted and the substrate surface can be prepared for the growth of a monocrystalline oxide layer by depositing an alkaline earth metal oxide, such as strontium oxide, strontium barium oxide, or barium oxide, onto the substrate surface by MBE at a low temperature and by subsequently heating the structure to a temperature of about 750° C. At this temperature, a solid state reaction takes place between the strontium oxide and the native silicon oxide causing the reduction of the native silicon oxide and leaving an ordered 2×1 structure. Again, this forms a template for the subsequent growth of an ordered monocrystalline oxide layer.

Following the removal of the silicon oxide from the surface of the substrate, in accordance with one embodiment of the invention, the substrate is cooled to a temperature in the range of about 200–800° C. and a layer of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stoichiometric strontium titanate at a growth rate of about 0.3–0.5 nm per minute. After initiating growth of the strontium titanate, the partial pressure of oxygen is increased above the initial minimum value. The overpressure of oxygen causes the growth of an amorphous silicon oxide layer at the interface between the underlying substrate and the growing strontium titanate layer. The growth of the silicon oxide layer results from the diffusion of oxygen through the growing strontium titanate layer to the interface where the oxygen reacts with silicon at the surface of the underlying substrate. The strontium titanate grows as an ordered (100) monocrystal with the (100) crystalline orientation rotated by 45° with respect to the underlying substrate. Strain that otherwise might exist in the strontium titanate layer because of the small mismatch in lattice constant between the silicon substrate and the growing crystal is relieved in the amorphous silicon oxide intermediate layer.

After the strontium titanate layer has been grown to the desired thickness, the monocrystalline strontium titanate is capped by a template layer that is conducive to the subsequent growth of an epitaxial layer of a desired monocrystalline layer 32. For example, for the subsequent growth of a monocrystalline germanium layer, the MBE growth of the strontium titanate monocrystalline layer can be capped by terminating the growth with 1–2 monolayers of titanium, 1–2 monolayers of titanium-oxygen or with 1–2 monolayers of strontium-oxygen. Following the formation of this capping layer, silicon cap layer 31 may be formed using MBE growth techniques. Following the formation of the template (and, if desired, cap layer 31), layer 32 is formed by epitaxially growing, for example, a layer of germanium.

The structure illustrated in FIG. 2 can be formed by the process discussed above with the addition of an additional monocrystalline layer 26 deposition step. Layer 26 is suitably formed overlying the template or cap layer using methods described above.

Structure 34, illustrated in FIG. 3, may be formed by growing an accommodating buffer layer, forming an amorphous oxide layer over substrate 22, and growing monocrystalline layer 32 over the accommodating buffer layer, as described above. The accommodating buffer layer, the amorphous oxide layer, and the cap layer are then exposed to an anneal process sufficient to change the crystalline structure of the accommodating buffer layer from monocrystalline to amorphous, thereby forming an amorphous layer such that the combination of the amorphous oxide layer, the now amorphous accommodating buffer layer, and a portion of cap layer 31 form a single amorphous layer 36. In accordance with one embodiment of the invention, layers 32 and 26 are then subsequently grown over layer 31. Alternatively, the anneal process may be carried out subsequent to growth of layer 32.

In accordance with one aspect of this embodiment, layer 36 is formed by exposing substrate 22, the accommodating buffer layer, the amorphous oxide layer, and cap layer 31 to a rapid thermal anneal process with a peak temperature of about 700° C. to about 1000° C. and a process time of about 5 seconds to about 10 minutes. However, other suitable anneal processes may be employed to convert the accommodating buffer layer to an amorphous layer in accordance with the present invention. For example, laser annealing, electron beam annealing, or "conventional" thermal annealing processes (in the proper environment) may be used to form layer 36. When conventional thermal annealing is employed to form layer 36, an overpressure of one or more constituents of layer 30 and/or 31 may be required to prevent degradation of the layer(s) during the anneal process.

The process described above illustrates a process for forming a semiconductor structure including a silicon substrate, an overlying oxide layer, and a monocrystalline material layer comprising a germanium semiconductor layer by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, other monocrystalline accommodating buffer layers such as alkaline earth metal titanates, zirconates, hafnates, tantalates, vanadates, ruthenates, and niobates, perovskite oxides such as alkaline earth metal tin-based perovskites, lanthanum aluminate, lanthanum scandium oxide, and gadolinium oxide can also be grown. Further, by a similar process such as MBE, other monocrystalline material layers comprising other semiconductors, metals and other materials can be deposited overlying the monocrystalline graded layer.

Each of the variations of monocrystalline material layers, monocrystalline graded layers, and monocrystalline accommodating buffer layers preferably uses an appropriate template for initiating the growth of the monocrystallie layer. For example, if the accommodating buffer layer is an alkaline earth metal zirconate, the oxide can be capped by a thin layer of zirconium. The deposition of zirconium can be followed by the deposition of silicon to react with the zirconium as a precursor to depositing silicon germanium. Similarly, if the monocrystalline accommodating buffer layer is an alkaline earth metal hafnate, the oxide layer can be capped by a thin layer of hafnium. The deposition of hafnium is followed by the deposition of silicon. In a similar manner, strontium titanate can be capped with a layer of strontium or strontium and oxygen and barium titanate can be capped with a layer of barium or barium and oxygen. Each of these depositions can be followed by the deposition of silicon to react with the capping material to form a template for the deposition of a monocrystalline material layer comprising graded monocrystalline materials such as SiGe and SiC.

Figure 5:
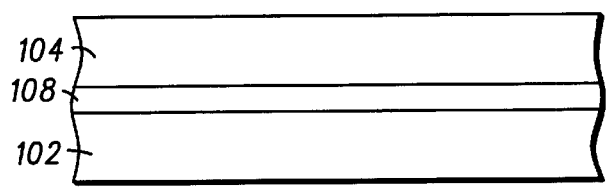
FIGS. 5–7 illustrate schematically, in cross-section, the formation of yet another embodiment of a device structure in accordance with the invention.
Figure 6:
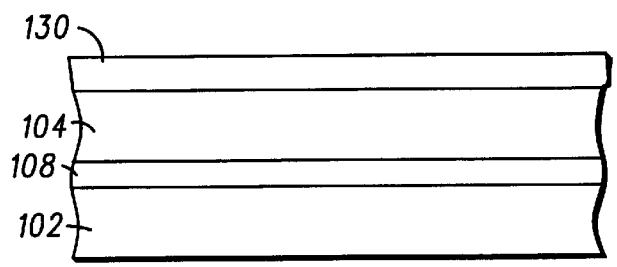
Figure 7:
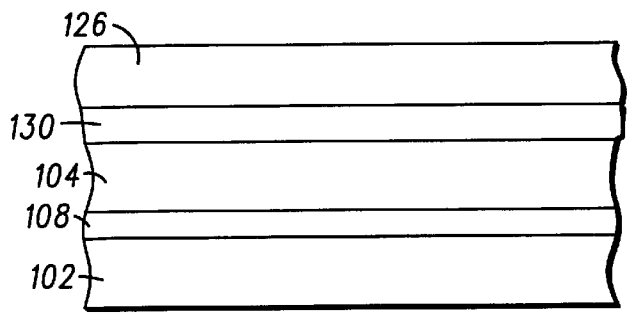

FIGS. 5–7 schematically illustrate, in cross-section, the formation of another embodiment of a device structure in accordance with the invention. This embodiment includes a compliant layer that functions as a transition layer that uses clathrate or Zintl type bonding. More specifically, this embodiment utilizes an intermetallic template layer to reduce the surface energy of the interface between material layers thereby allowing for two dimensional layer by layer growth.

The structure illustrated in FIG. 5 includes a monocrystalline substrate 102, an amorphous interface layer 108 and an accommodating buffer layer 104. Amorphous intermediate layer 108 is grown on substrate 102 at the interface between substrate 102 and accommodating buffer layer 104 as previously described with reference to FIGS. 1 and 2. Amorphous interface layer 108 may comprise any of those materials previously described with reference to amorphous interface layer 28 in FIGS. 1 and 2 but preferably comprises a monocrystalline oxide material such as a monocrystalline layer of $Ca_zSr_{1-z}TiO_3$ where z ranges from 0 to 1. Substrate 102 is preferably silicon but may also comprise any of those materials previously described with reference to substrate 22 in FIGS. 1–3.

A template layer 130 is deposited over accommodating buffer layer 104 as illustrated in FIG. 5 and preferably comprises a thin layer of Zintl type phase material composed of metals and metalloids having a great deal of ionic character. As in previously described embodiments, template layer 130 is deposited by way of MBE, CVD, MOCVD, MEE, ALE, PVD, CSD, PLD, or the like to achieve a thickness of one monolayer. Template layer 130 functions as a "soft" layer with non-directional bonding but high crystallinity which absorbs stress build up between layers having lattice mismatch. Materials for template 130 may include, but are not limited to, materials containing Si, Ga, In, Sr, and Sb such as, for example, $SrAl_2$, $(MgCaYb)Ga_2$, $(Ca,Sr,Eu,Yb)In_2$, $BaGe_2As$, and $SrSn_2As_2$.

A monocrystalline graded material layer 126 is epitaxially grown over template layer 130 to achieve the final structure illustrated in FIG. 7. As a specific example, an $SrAl_2$ layer may be used as template layer 130 and an appropriate monocrystalline material layer 126 such as a compound semiconductor material $Si_yGe_{1-y}$, where y ranges from 0 to 1, is grown over the $SrAl_2$. The Al—Ti (from the accommodating buffer layer of layer of $Ca_zSr_{1-z}TiO_3$ where z ranges from 0 to 1) bond is mostly metallic while the Al—Ge (from the $Si_yGe_{1-y}$ layer) bond is weakly covalent. The Sr participates in two distinct types of bonding with part of its electric charge going to the oxygen atoms in the lower accommodating buffer layer 104 comprising $Ca_zSr_{1-y}TiO_3$ to participate in ionic bonding and the other part of its valence charge being donated to Al in a way that is typically carried out with Zintl phase materials. The amount of the charge transfer depends on the relative electronegativity of elements comprising the template layer 130 as well as on the interatomic distance. In this example, Al assumes an $sp^3$ hybridization and can readily form bonds with monocrystalline material layer 126, which in this example, comprises semiconductor material $Si_yGe_{1-y}$.

The compliant substrate produced by use of the Zintl type template layer used in this embodiment can absorb a large strain without a significant energy cost. In the above example, the bond strength of the Al is adjusted by changing the volume of the $SrAl_2$ layer thereby making the device tunable for specific applications which include the monolithic integration of Si devices and the monolithic integration of high-k dielectric materials for CMOS technology.

Figure 8:
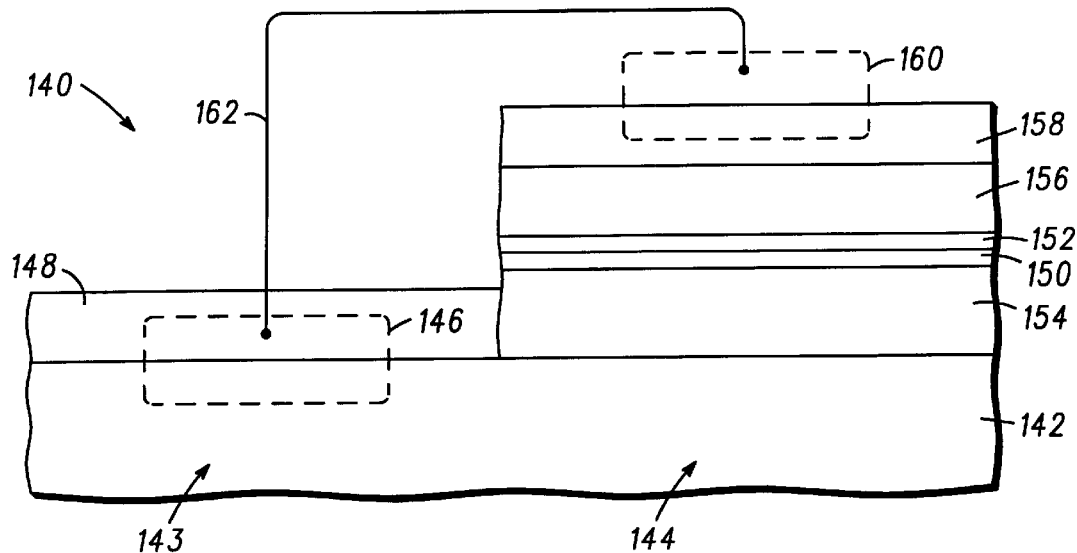
FIG. 8 illustrates schematically, in cross section, a monolithic integrated circuit in accordance with one embodiment of the invention.

FIG. 8 illustrates schematically, in cross section, a device structure 140 in accordance with a further embodiment of the invention. Device structure 140 includes a monocrystalline semiconductor substrate 142, preferably a monocrystalline silicon wafer. Monocrystalline semiconductor substrate 142 includes two regions, 143 and 144. An electrical semiconductor component generally indicated by the dashed line 146 is formed, at least partially, in region 143. Electrical component 146 can be a resistor, a capacitor, an active semiconductor component such as a diode or a transistor or an integrated circuit such as a CMOS integrated circuit. For example, electrical semiconductor component 146 can be a CMOS integrated circuit configured to perform digital signal processing or another function for which silicon integrated circuits are well suited. The electrical semiconductor component in region 143 can be formed by conventional semiconductor processing as well known and widely practiced in the semiconductor industry. A layer of insulating material 148 such as a layer of silicon dioxide or the like may overlie electrical semiconductor component 146.

Insulating material 148 and any other layers that may have been formed or deposited during the processing of semiconductor component 146 in region 143 are removed from the surface of region 144 to provide a bare silicon surface in that region. As is well known, bare silicon surfaces are highly reactive and a native silicon oxide layer can quickly form on the bare surface. A layer of strontium or strontium and oxygen is deposited onto the native oxide layer on the surface of region 144 and is reacted with the oxidized surface to form a first template layer (not shown). In accordance with one embodiment of the invention a monocrystalline oxide layer is formed overlying the template layer by a process of molecular beam epitaxy. Reactants including calcium, strontium, titanium and oxygen are deposited onto the template layer to form the monocrystalline oxide layer. Initially during the deposition the partial pressure of oxygen is kept near the minimum necessary to fully react with the calcium, strontium, and titanium to form the monocrystalline calcium strontium titanate layer. The partial pressure of oxygen is then increased to provide an overpressure of oxygen and to allow oxygen to diffuse through the growing monocrystalline oxide layer. The oxygen diffusing through the calcium strontium titanate reacts with silicon at the surface of region 144 to form an amorphous layer of silicon oxide on the second region and at the interface between the silicon substrate and the monocrystalline oxide.

In accordance with an embodiment of the invention, the step of depositing the monocrystalline oxide layer is terminated by depositing a layer 150, which can be 1–10 monolayers of titanium, barium, strontium, barium and oxygen, titanium and oxygen, or strontium and oxygen. A cap layer 152 of a monocrystalline semiconductor material is then deposited overlying the second template layer by a process of molecular beam epitaxy.

In accordance with one aspect of the present embodiment, after layer 152 formation, the monocrystalline titanate layer and the silicon oxide layer, which is interposed between substrate 142 and the titanate layer, are exposed to an anneal process such that the titanate and oxide layers form an amorphous oxide layer 154. A graded layer 156, comprising $Si_yGe_{1-y}$ (where y ranges from 0 to 1) in accordance with one embodiment of the invention, is then epitaxially grown over layer 152, using the techniques described above in connection with layer 32 of FIG. 1. Alternatively, the above described anneal process can be performed before formation of template layer 152.

Next, a layer of monocrystalline material 158, such as Ge, is formed above graded layer 156. Layer 158 may be formed using any of the material and any of the techniques previously described herein in connection with layer 26.

In accordance with a further embodiment of the invention, a semiconductor component, generally indicated by a dashed line 160 is formed, at least partially, in compound semiconductor layer 158. Semiconductor component 160 can be formed by processing steps conventionally used in the fabrication of Ge devices. A metallic conductor schematically indicated by the line 162 can be formed to electrically couple device 146 and device 160, thus implementing an integrated device that includes at least one component formed in the silicon substrate and one device formed in the monocrystalline material layer. Although illustrative structure 140 has been described as a structure formed on a silicon substrate 142 and having a strontium or calcium strontium titanate layer and a germanium layer 158, similar devices can be fabricated using other monocrystalline substrates, oxide layers and other monocrystalline material layers as described elsewhere in this disclosure.

Figure 9:
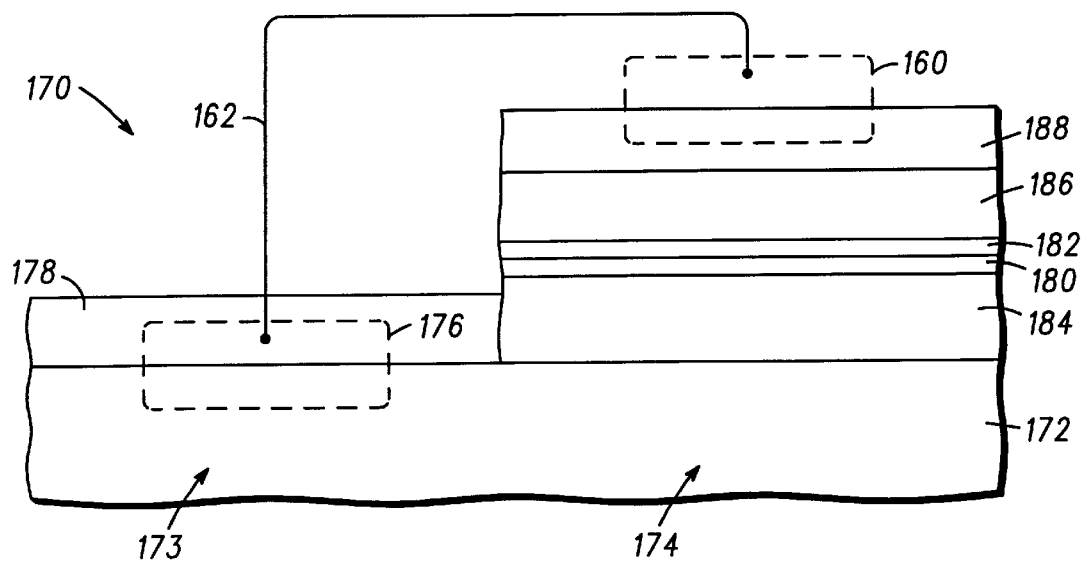
FIG. 9 illustrates schematically, in cross section, a monolithic integrated circuit in accordance with yet another embodiment of the invention.

For example, FIG. 9 illustrates schematically, in cross section, a device structure 170 in accordance with a further embodiment of the invention. Device structure 170 includes a monocrystalline semiconductor substrate 172, preferably a monocrystalline silicon wafer. Monocrystalline semiconductor substrate 172 includes two regions, 173 and 174. An electrical semiconductor component generally indicated by the dashed line 176 is formed, at least partially, in region 173. Electrical component 176 can be a resistor, a capacitor, an active semiconductor component such as a diode or a transistor or an integrated circuit such as a CMOS integrated circuit. For example, electrical semiconductor component 176 can be a CMOS integrated circuit configured to perform digital signal processing or another function for which silicon integrated circuits are well suited. The electrical semiconductor component in region 173 can be formed by conventional semiconductor processing as well known and widely practiced in the semiconductor industry. A layer of insulating material 178 such as a layer of silicon dioxide or the like may overlie electrical semiconductor component 176.

Insulating material 178 and any other layers that may have been formed or deposited during the processing of semiconductor component 176 in region 173 are removed from the surface of region 174 to provide a bare silicon surface in that region. A layer of strontium or strontium and oxygen is deposited onto the native oxide layer on the surface of region 174 and is reacted with the oxidized surface to form a first template layer (not shown). In accordance with one embodiment of the invention a monocrystalline oxide layer is formed overlying the template layer by a process of molecular beam epitaxy. Reactants including strontium, titanium and oxygen are deposited onto the template layer to form the monocrystalline oxide layer. Initially during the deposition the partial pressure of oxygen is kept near the minimum necessary to fully react with the strontium and titanium to form the monocrystalline strontium titanate layer. The partial pressure of oxygen is then increased to provide an overpressure of oxygen and to allow oxygen to diffuse through the growing monocrystalline oxide layer. The oxygen diffusing through the strontium titanate reacts with silicon at the surface of region 174 to form an amorphous layer of silicon oxide on the second region and at the interface between the silicon substrate and the monocrystalline oxide.

In accordance with an embodiment of the invention, the step of depositing the monocrystalline oxide layer is terminated by depositing a layer 180, which can be 1–10 monolayers of titanium, barium, strontium, barium and oxygen, titanium and oxygen, or strontium and oxygen. A cap layer 182 of a monocrystalline semiconductor material is then deposited overlying the second template layer by a process of molecular beam epitaxy.

In accordance with one aspect of the present embodiment, after layer 182 formation, the monocrystalline titanate layer and the silicon oxide layer, which is interposed between substrate 172 and the titanate layer, are exposed to an anneal process such that the titanate and oxide layers form an amorphous oxide layer 184. A layer 186, comprising Ge in accordance with this embodiment of the invention, is then epitaxially grown over layer 182, using the techniques described above in connection with layer 32 of FIG. 1. Alternatively, the above described anneal process can be performed before formation of template layer 182.

Next, a layer of monocrystalline material 188, such as Ge, is formed above layer 186. Layer 188 may be formed using any of the material and any of the techniques previously described herein in connection with layer 26.

In accordance with a further embodiment of the invention, a semiconductor component, generally indicated by a dashed line 160 is formed, at least partially, in semiconductor layer 188. A metallic conductor schematically indicated by the line 162 can be formed to electrically couple device 176 and device 160, thus implementing an integrated device that includes at least one component formed in the silicon substrate and one device formed in the monocrystalline material layer.

Clearly, those embodiments specifically describing structures having two different Group IV semiconductor portions are meant to illustrate embodiments of the present invention and not limit the present invention. There are a multiplicity of other combinations and other embodiments of the present invention. For example, the present invention includes structures and methods for fabricating material layers which form semiconductor structures, devices and integrated circuits including other layers such as metal and non-metal layers. More specifically, the invention includes structures and methods for forming a compliant substrate which is used in the fabrication of semiconductor structures, devices and integrated circuits and the material layers suitable for fabricating those structures, devices, and integrated circuits.

In accordance with one embodiment of this invention, a monocrystalline semiconductor wafer can be used in forming monocrystalline material layers over the wafer. In this manner, the wafer is essentially a "handle" wafer used during the fabrication of semiconductor electrical components within a monocrystalline layer overlying the wafer. Therefore, electrical components can be formed within semiconductor materials over a wafer of at least approximately 200 millimeters in diameter and possibly at least approximately 300 millimeters.

By the use of this type of substrate, a relatively inexpensive "handle" wafer overcomes the fragile nature of some monocrystalline material wafers by placing them over a relatively more durable and easy to fabricate base material. Therefore, an integrated circuit can be formed such that all electrical components, and particularly all active electronic devices, can be formed within or using the monocrystalline material layer even though the substrate itself may include a different monocrystalline semiconductor material. Fabrication costs for some devices employing non-silicon monocrystalline materials should decrease because larger substrates can be processed more economically and more readily compared to the relatively smaller and more fragile substrates (e.g., conventional compound semiconductor wafers).

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A semiconductor structure comprising:
   a monocrystalline substrate;
   an accommodating buffer layer formed on the substrate;
   a template formed on the monocrystalline accommodating buffer layer; and
   a monocrystalline layer formed overlying the template, said monocrystalline layer comprises a material selected from the group consisting of Si, SiC, Ge, and $Si_yGe_{1-y}$, where y ranges from 0 to 1.

2. The semiconductor structure of claim 1, further comprising an amorphous layer interposed between the monocrystalline substrate and the accommodating buffer layer.

3. The semiconductor structure of claim 2, wherein the amorphous layer comprises silicon oxide.

4. The semiconductor structure of claim 2, wherein the amorphous layer is about 0.5 to about 5.0 nanometers thick.

5. The semiconductor structure of claim 1, wherein the accommodating buffer layer comprises an oxide selected from the group consisting of alkaline earth metal titanates, alkaline earth metal zirconates, alkaline earth metal hafnates, alkaline earth metal tantalates, alkaline earth metal ruthenates, alkaline earth metal niobates, and perovskite oxides.

6. The semiconductor structure of claim 1, wherein the accommodating buffer layer comprises $Ca_zSr_{1-z}TiO_3$, where z ranges from 0 to 1.

7. The semiconductor structure of claim 1, wherein the accommodating buffer layer is about 2 to about 100 nanometers thick.

8. The semiconductor structure of claim 1, wherein the accommodating buffer layer is about 5 nanometers thick.

9. The semiconductor structure of claim 1, wherein the monocrystalline graded layer is about 1 nanometer to about 100 microns thick.

10. The semiconductor structure of claim 9, wherein the monocrystalline graded layer is about 0.1 to about 5 microns thick.

11. The semiconductor structure of claim 1, further comprising a cap layer.

12. The semiconductor structure of claim 11, wherein the cap layer comprises monocrystalline silicon.

13. The semiconductor structure of claim 1, wherein the accommodating buffer layer includes an amorphous film.

14. The semiconductor structure of claim 1, wherein the accommodating buffer layer includes a monocrystalline film.

15. A microelectronic device formed using the semiconductor structure of claim 1.

16. The semiconductor structure of claim 1, wherein said template is a Zintl type phase material.

17. The semiconductor structure of claim 1, wherein said template is selected from the group consisting of $SrAl_2$, $(MgCaYb)Ga_2$, (Ca, Sr, Eu, Yb) $In_2$, $BaGe_2As$, and $SrSn_2As_2$.

18. The semiconductor structure of claim 1, wherein said template is 1–10 monolayers of Sr—Si, $SiO_x$, Sr—Si—O, Ti—Si, Ti—Ge, Sr—Ge—O, Sr—Ge, or $GeO_x$.

19. The semiconductor structure of claim 1, wherein said template is 1–2 monolayers of Ti—Ge, Sr—Ge—O, Sr—Ge, or $GeO_x$.

20. The semiconductor structure of claim 1, wherein said monocrystalline layer comprises SiC.

21. The semiconductor structure of claim 1, wherein said monocrystalline layer comprises Ge.

22. The semiconductor structure of claim 1, wherein said monocrystalline layer comprises $Si_yGe_{1-y}$ where y ranges from >0 to 1.

* * * * *